United States Patent
Yanagisawa et al.

(10) Patent No.: US 7,011,994 B2
(45) Date of Patent: *Mar. 14, 2006

(54) METHOD OF FORMING WIRING AND METHOD OF MANUFACTURING IMAGE DISPLAY SYSTEM BY USING THE SAME

(75) Inventors: Yoshiyuki Yanagisawa, Kanagawa (JP); Toshiaki Iwafuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 36 days.

This patent is subject to a terminal disclaimer.

(21) Appl. No.: 11/078,889

(22) Filed: Mar. 10, 2005

(65) Prior Publication Data

US 2005/0158989 A1   Jul. 21, 2005

Related U.S. Application Data

(63) Continuation of application No. 10/311,704, filed as application No. PCT/JP02/03674 on Apr. 12, 2002, now Pat. No. 6,933,208.

(30) Foreign Application Priority Data

Apr. 18, 2001  (JP) ............................ P2001-120119

(51) Int. Cl.
 H01L 21/00  (2006.01)
 H01L 21/4763  (2006.01)
(52) U.S. Cl. ...................... 438/149; 438/160; 438/164; 438/640; 438/662
(58) Field of Classification Search ............... 438/637, 438/640, 662, 700, 701, 706, 149, 155, 160, 438/164
See application file for complete search history.

(56) References Cited

U.S. PATENT DOCUMENTS 6,631,558 B1 * 10/2003 Burgess ........................ 29/852
2003/0007332 A1 * 1/2003 Seki et al. ................... 361/750

* cited by examiner

*Primary Examiner*—Hsien-Ming Lee
(74) *Attorney, Agent, or Firm*—Bell, Boyd & Lloyd LLC

(57) ABSTRACT

A method for forming via holes includes placing an insulating layer on a first wiring layer, forming opening portions in the insulating layer, and forming a second wiring layer on the insulating layer. At the time of forming the opening portions, the insulating layer is irradiated with a laser beam with the focus position staggered.

5 Claims, 11 Drawing Sheets

METHOD OF FORMING WIRING AND METHOD OF MANUFACTURING IMAGE DISPLAY SYSTEM BY USING THE SAME

CROSS REFERENCE TO RELATED APPLICATIONS

The present application is a continuation of U.S. patent application Ser. No. 10/311,704, filed on Dec. 17, 2002, now U.S. Pat. No. 6,933,208, which is a 371 of PCT/JP02/03674, filed on Apr. 12, 2002, the disclosure of which is herein incorporated by reference.

BACKGROUND OF THE INVENTION

The present invention relates to a method of forming a wiring in a multi-layer wiring substrate, and particularly to an improvement in a method of forming an opening portion for inter-layer connection. Further, the present invention relates to a method of arranging devices and a method of manufacturing an image display system by using the method of forming a wiring.

In the case of arranging light-emitting devices in a matrix form to assemble an image display system, it has been a practice to form the devices directly on a substrate as in the cases of a liquid crystal display system (LCD) and a plasma display panel (PDP), or to arrange singular LED packages as in the case of a light-emitting diode display (LED display). For example, in the case of an image display system such as the LCD and the PDP, the devices cannot be separated, so that it has been a practice to form the devices at intervals equal to the pixel pitch of the image display system from the beginning of the manufacture process.

On the other hand, in the case of the LED display, it has been a practice to take out the LED chips after dicing, and connect the LED chips individually to external electrodes by wire bonding or bump connection by flip chips, thereby packaging. In this case, the LED chips are arranged at the pixel pitch of the image display system before or after the packaging, and the pixel pitch is independent from the pitch of the devices at the time of forming the devices.

Since the LED (light-emitting diode) being a light-emitting device is expensive, the cost of the image display system using LEDs can be lowered by producing a multiplicity of LED chips from a single sheet of wafer. Namely, when the size of the LED chips having hitherto been about 300 $\mu$m square is made to be several tens of $\mu$m square and the LED chips are connected to manufacture an image display system, the price of the image display system can be lowered.

In view of the above, a technology has developed in which devices are produced in a high degree of integration, and the devices are moved into a wider area while being spaced wider apart by transfer or the like to constitute a comparatively large sized display system such as an image display system. For example, there have been known such technologies as a thin film transfer method described in U.S. Pat. No. 5,438,241 and a method of producing a display transistor array panel described in Japanese Patent Laid-open No. Hei 11-142878. In the U.S. Pat. No. 5,438,241, a transfer method by which devices formed densely on a substrate are rearranged coarsely is disclosed. In this method, the devices are transferred onto an adhesive-coated extensible and contractable substrate, and thereafter the extensible and contractable substrate is extended in X direction and Y direction while monitoring the intervals and positions of the devices. Then, the devices on the extended substrate are transferred onto a required display panel. In the technology described in the Japanese Patent Laid-open No. Hei 11-142878, thin film transistors constituting a liquid crystal display portion on a first substrate are wholly transferred onto a second substrate, and then the thin film transistors are selectively transferred from the second substrate onto a third substrate corresponding to the pixel pitch.

In the cases of manufacturing the image display system by the transfer technologies as mentioned above, it is preferable to process the devices into chip component parts, in order to realize efficient transfer and highly accurate transfer. In order to process the devices into chip component parts, it suffices to bury the devices in an insulating material (for example, resin) and to dice the resultant body on a device basis.

When the devices are processed into the chip component parts, it is necessary to form opening portions (the so-called via holes) for making electrical connection in the insulating material in correspondence with electrodes of the devices. It is also necessary to form via holes for contriving inter-layer connection between a wiring layer provided on the substrate and the electrodes of the devices, after the final transfer. The formation of via holes is necessarily required not only in the transfer technologies but also in the cases of other multi-layer wiring substrates needing inter-layer connection, and knowing how to form the via holes is a major key to securing of reliability of the multi-layer wiring substrates. Conventionally, as a technique of forming via holes in a multi-layer wiring substrate, mechanical processing has been conducted. In mechanical processing, the so-called burrs are liable to be generated, and, therefore, mechanical processing is unsuited to fine processing. In addition, mechanical processing leads to generation of strains and may result in needless stresses being exerted on the substrate. Besides, as a method of forming minute via holes, such techniques as etching may also be contemplated, but these techniques require very intricate steps and are disadvantageous on a productivity basis. Particularly where a multi-layer body is composed of different materials, a plurality of times of etching by changing the etchant are required, leading to an increase in the number of processes and an increase in production cost. Further, in the formation of the via holes, the shape of the via holes is also an important factor. For example, where the via hole is so shaped that the side wall thereof is erected nearly vertically, upon formation of a wiring layer consisting of a metallic material, the metal would not easily be adhered onto the side wall, which leads to defects or failure in conduction.

SUMMARY OF THE INVENTION

The present invention has been proposed in consideration of the above-mentioned circumstances of the related art. Accordingly, the present invention provides in an embodiment a method of forming a wiring by which via holes can be easily formed, a good via hole shape can be realized, and defects or failure in conduction can be prevented, and to provide a method of arranging devices and a method of manufacturing an image display system by applying the same.

In accordance with the present invention, there is provided a method of forming a wiring including the steps of forming an insulating layer on a first wiring layer, forming an opening portion in the insulating layer and forming a second wiring layer. The insulating layer is irradiated with a laser beam with the focus position staggered to thereby form the opening portion.

By forming the opening portion by use of the laser beam, a minute opening portion can be formed, and it is ensured that generation of strains and exertion of needless stresses are prevented from occurring at the time of formation of the opening portion. In addition, the process is simpler than etching. Furthermore, since the focus position of the laser beam is staggered, the side wall of the opening portion becomes an inclined surface, so that upon formation of the wiring layer thereon, the secure adhesion is performed also onto the side walls of the opening portion.

Moreover, in accordance with the present invention, there is provided a method of arranging devices for arranging a plurality of devices arranged on a first substrate onto a second substrate, including a first transfer step of transferring the devices from the first substrate onto a temporary holding member so that the devices are spaced wider apart than they have been arranged on the first substrate and holding the devices on the temporary holding member. A second transfer step transfers the devices held on the temporary holding member onto the second substrate while spacing the devices further wider apart, wherein an inter-layer insulating layer is irradiated with a laser beam with the focus position staggered to thereby form opening portions, and a wiring for inter-layer connection is formed. According to the arranging method, the transfer of the devices is conducted efficiently and securely while realizing good inter-layer connection, and the enlarged transfer for enlarging the intervals of the devices is carried out smoothly.

Furthermore, in accordance with the present invention, there is provided a method of manufacturing an image display system including light-emitting devices arranged in a matrix form. The method includes a first transfer step of transferring the light-emitting devices from a first substrate onto a temporary holding member so that the light-emitting devices are spaced wider apart than they have been arranged on the first substrate, and holding the light-emitting devices on the temporary holding member. A second transfer step transfers the light-emitting devices held on the temporary holding member onto a second substrate while spacing the light-emitting devices further wider apart. A wiring forming step forms a wiring for connection of each of the light-emitting devices, wherein an inter-layer insulating layer is irradiated with a laser beam with the focus position staggered to thereby form opening portions, and a wiring for inter-layer connection is formed.

According to the method of manufacturing the image display system, the light-emitting devices are arranged in a matrix form by the above-mentioned arranging method, to constitute an image display portion. Therefore, the light-emitting devices produced by fine processing in a dense condition, namely, in a high degree of integration can be efficiently rearranged while being spaced wider apart, and productivity is enhanced largely. In addition, good inter-layer connection is realized, and conduction between the light-emitting devices and the wiring layer on the second substrate is securely achieved.

Additional features and advantages of the present invention are described in, and will be apparent from, the following Detailed Description of the Invention and the figures.

BRIEF DESCRIPTION OF THE FIGURES

FIGS. 9A and 9B are views showing one example of the light-emitting device, in which FIG. 9A is a sectional view, and FIG. 9B is a plan view;

DETAILED DESCRIPTION OF THE INVENTION

Figure 1:
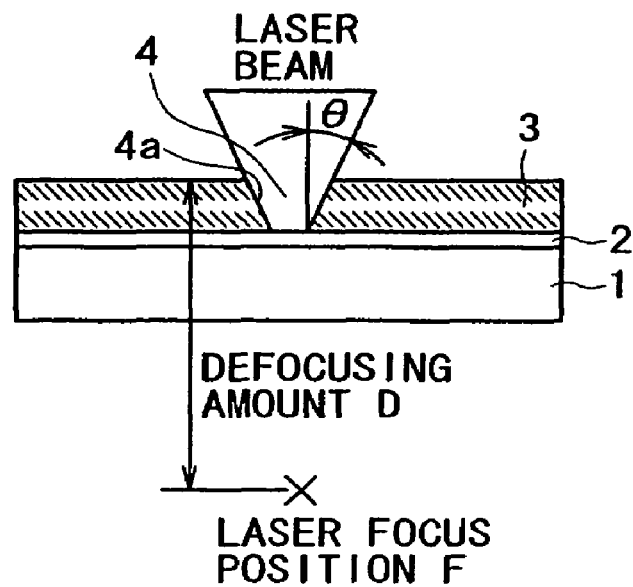
FIG. 1 is a general sectional view showing an opening portion forming step in inter-layer connection of a multi-layer wiring substrate.

Now, a method of forming a wiring, a method of arranging devices, and a method of manufacturing an image display system by application of the present invention will be described in detail below referring to the drawings. First, the method of forming a wiring according to the present invention will be described, by taking inter-layer connection in a multi-layer wiring substrate as an example.

The inter-layer connection in the multi-layer wiring substrate is basically conducted through a step of forming an opening portion (via hole) in an insulating layer functioning as an inter-layer insulating film, and a step of forming a wiring layer for inter-layer connection. FIG. 1 illustrates the opening portion forming step, in which an insulating layer 3 is formed covering a first wiring layer 2 formed on a substrate 1, and the insulating layer 3 is irradiated with a laser beam to form a via hole 4. Here, the insulating layer 3 can be formed by use of an ultraviolet ray-curable adhesive (UV adhesive), a thermosetting resin such as an epoxy based resin and a polyimide resin, a thermoplastic resin such as polyolefin and polyester, etc. Therefore, as the laser beam used for forming the via hole 4, excimer laser and the like are preferable.

Figure 4:
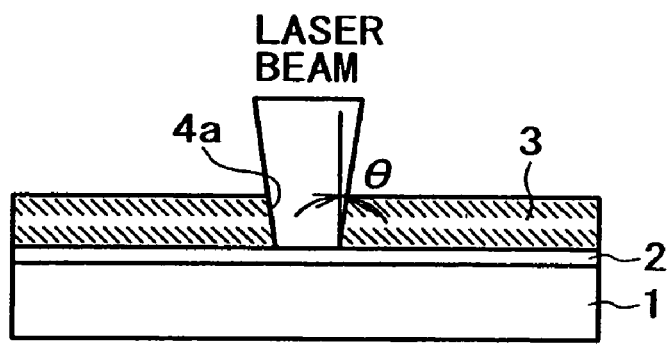
FIG. 4 is a general sectional view showing the shape of an opening portion formed by just focusing of the laser beam.
Figure 5:
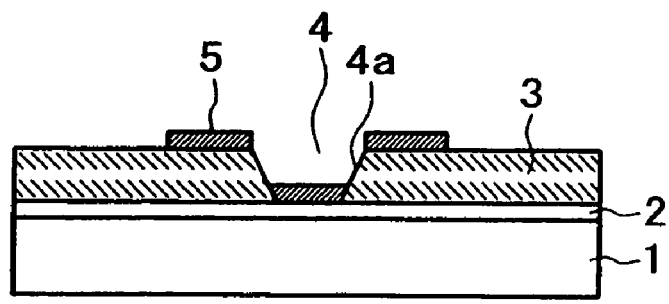
FIG. 5 is a general sectional view showing the condition of a wiring layer formed in the opening portion formed by just focusing of the laser beam.

Ordinarily, the irradiation with the laser beam for forming the via hole 4 is conducted so that the focus position of the laser beam coincides with the surface of the insulating layer 3, namely, conducted with just focusing, as shown in FIG. 4. In this case, the shape of the via hole 4 thus formed is nearly vertical, and the inclination angle θ of the side wall 4a is about 5 to 7 degrees. When a second wiring layer 5 is formed by such technique as metal vapor deposition and plating under this condition, metal would almost not be adhered onto the side wall 4a of the via hole 4. For example, where the second wiring layer 5 is formed by metal vapor deposition, a phenomenon occurs in which the metal is not adhered onto the side wall 4a being nearly vertical, due to the characteristic property of vapor deposition. Similarly, where the second wiring layer 5 is formed by plating, the via hole 4 being nearly vertical in shape leads to that the plating solution would not easily enter into the via hole 4, so that the plating film is not formed on the side wall 4a. As a result, the second wiring layer 5 is split as shown in FIG. 5, and conduction cannot be achieved between the second wiring layer 5 and the first wiring layer 2.

Figure 2:
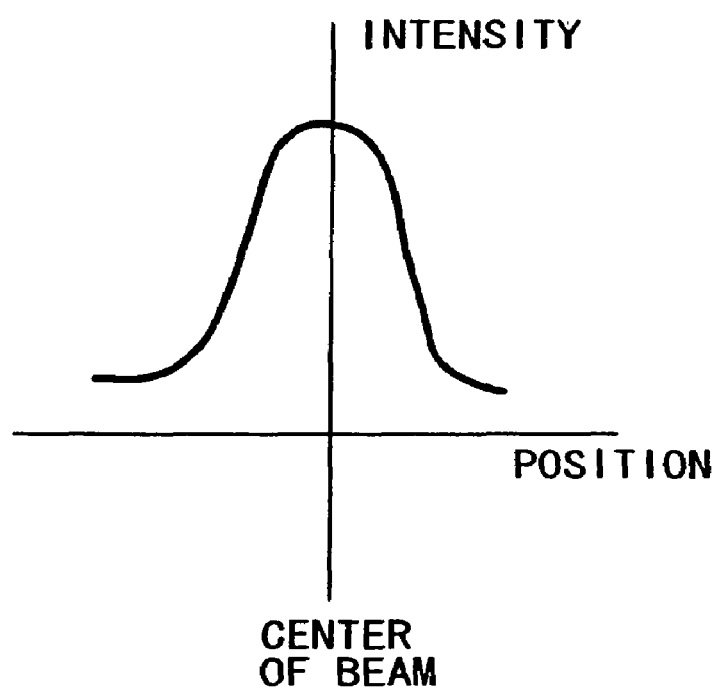
FIG. 2 is a characteristic diagram showing the manner of intensity distribution in a laser beam.

In view of the above, according to the present invention, the laser beam for irradiation is not used with just focusing, but the laser via processing is conducted by staggering the focus position (laser focus position) F from the surface of the insulating layer 3 (so-called defocusing). Generally, a laser beam has an intensity distribution in the radial direction of the beam. As shown in FIG. 2, the intensity distribution can be broadened by the defocusing. Upon irradiation with the laser beam having such a broadened intensity distribution, the laser via processing proceeds rapidly due to the high beam intensity at a central portion of the beam diameter, while the laser via processing proceeds slowly due to the low beam intensity at a peripheral portion of the beam diameter. As a result, the taper angle of the via hole 4 formed, namely, the inclination angle θ of the side wall 4a is enlarged.

Figure 3:
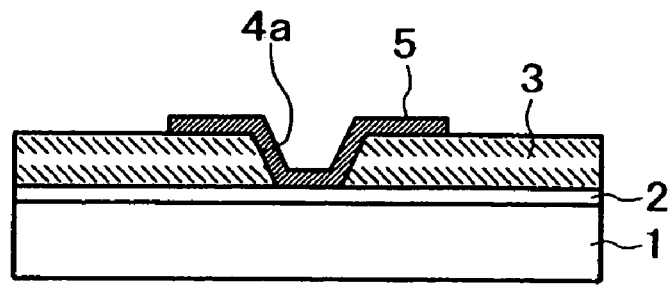
FIG. 3 is a general sectional view showing a second wiring layer forming step in the inter-layer connection of the multi-layer wiring substrate.

When the formation of the second wiring layer 5 is conducted under this condition, metal vapor deposition properties and plating properties are both enhanced, so that the side wall 4a of the via hole 4 is also covered with the second wiring layer 5, as shown in FIG. 3, and conduction between the second wiring layer 5 and the first wiring layer 2 can be securely contrived. While the second wiring layer 5 is formed by forming a film of a metallic material by metal vapor deposition or plating, examples of the metallic material to be used here include copper, aluminum, gold and the like.

At the time of the laser via processing by the defocusing, the inclination angle θ of the side wall 4a of the via hole 4 is preferably not less than 20 degrees. When the inclination angle θ of the side wall 4a is less than 20 degrees, the metal vapor deposition properties and plating properties are lowered, and the covering condition of the metallic film formed on the side wall 4a of the via hole 4 is degraded, causing defects or failure in conduction. As an example of the shape of the via hole 4 with the taper angle thus enlarged, the diameter at the surface of the insulating layer 3 is 30 to 70 μm and the diameter at the bottom surface is 15 to 30 μm, in the case where the thickness of the insulating layer 3 is 20 to 30 μm.

To ensure that the inclination angle θ of the side wall 4a of the via hole 4 is not less than 20 degrees, the defocusing amount D of the laser beam is preferably not less than 0.1 mm. Namely, the position of the focus F of the laser beam is preferably staggered by not less than 0.1 mm from the surface of the insulating layer 3. For example, when the defocusing amount D is 0.1 mm, a via hole 4 with the inclination angle θ of the side wall 4a being 24 degrees is formed. More preferably, the defocusing amount D is not less than 1 mm.

While the wiring forming method as a base has been described above, a method of arranging devices and a method of manufacturing an image display system, by a two-stage enlarged transfer method, as examples of application of the wiring forming method, will be described next.

In the present embodiment, a two-stage enlarged transfer is conducted in which, first, devices formed on a first substrate in a high degree of integration are transferred onto a temporary holding member so that the devices are spaced wider apart than they have been arranged on the first substrate, and then the devices held on the temporary holding member are transferred onto a second substrate while being spaced further apart. While the transfer is conducted in two stages in the present embodiment, the transfer may be conducted in three or more stages according to the degree of spacing-wider-apart of the devices.

Figure 6:
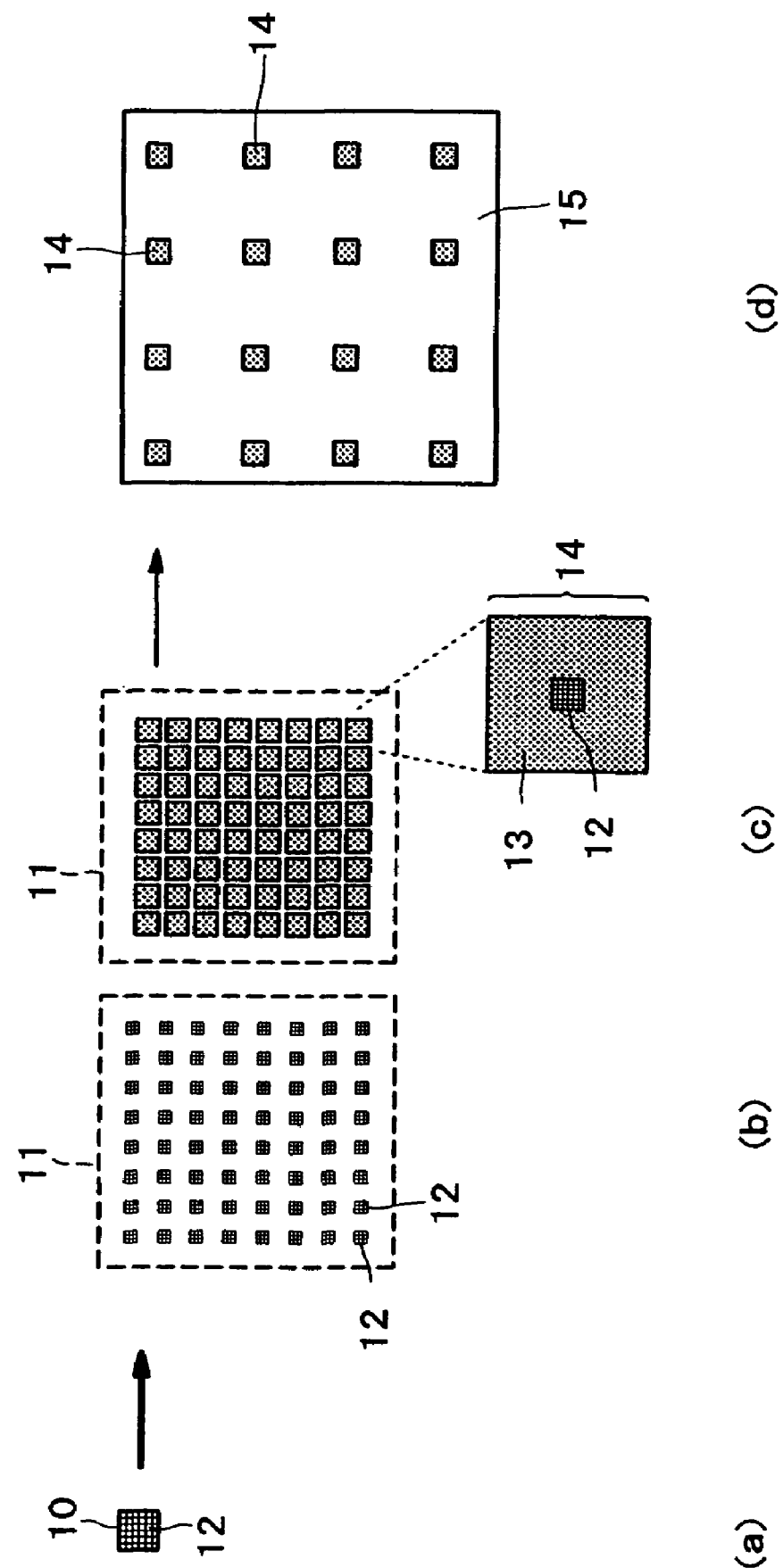
FIG. 6 is a schematic diagram showing a method of arranging devices.

FIG. 6 is a view showing basic steps of the two-stage enlarged transfer method. First, devices 12 such as, for example, light-emitting devices are formed densely on a first substrate 10 shown in (a) of FIG. 6. By forming the devices densely, it is possible to enlarge the number of the devices formed per substrate and to lower the product cost. The first substrate 10 may be any of various substrates on which the devices can be formed, such as, for example, a semiconductor wafer, a glass substrate, a quartz glass substrate, a sapphire substrate, a plastic substrate, etc. The devices 12 may be formed directly on the first substrate 10, or may be arranged on the first substrate 10 after being formed on another substrate.

Next, as shown in (b) of FIG. 6, the devices 12 are transferred from the first substrate 10 onto a temporary holding member 11 indicated by the broken line in the figure, and the devices 12 are held on the temporary holding member 11. Here, the adjacent devices 12 are spaced apart, and the devices 12 are arranged in a matrix form as shown in the figure. Namely, the devices 12 are so transferred that they are spaced wider apart in an x direction, and are so transferred that they are spaced wider apart also in a y direction orthogonal to the x direction. The intervals by which the devices are spaced apart are not particularly limited, and can be determined by taking into account the formation of resin portions or the formation of electrode pads in the subsequent step, for example. At the time of transfer from the first substrate 10 onto the temporary holding member 11, all of the devices on the first substrate 10 can be transferred while being spaced apart. In this case, it suffices that the size of the temporary holding member 11 is not less than a size obtained by multiplying the numbers (respectively in the x direction and in the y direction) of the devices 12 arranged in the matrix form by the intervals by which the devices 12 are spaced apart. In addition, it is also possible to ensure that some of the devices on the first substrate 10 are transferred onto the temporary holding member 11 while being spaced apart.

After the first transfer step as above, the devices 12 present on the temporary holding member 11 are spaced apart, as shown in (c) of FIG. 6, and surroundings of the devices are covered with a resin and electrode pads are formed for each device 12. The covering of the surroundings of the devices with the resin is conducted for facilitating the formation of the electrode pads, for facilitating the handling in the subsequent second transfer step, and for the like purposes. The electrode pads are formed in a comparatively large size so that defects or failure in wiring would not be generated in the last wiring, which follows the subsequent second transfer step, as will be described later. Incidentally, the electrode pads are not shown in (c) of FIG. 6. The surroundings of each device 12 are covered with the resin 13, whereby a resin-molded chip 14 is formed. While the device 12 is located roughly at the center of the resin-molded chip 14 in plan view as shown, it may be located near one side or a corner of the resin-molded chip 14.

Next, as shown in (d) of FIG. 6, the second transfer step is performed. In the second transfer step, the devices 12 arranged in a matrix form on the temporary holding member 11 are transferred onto a second substrate 15 while being spaced further wider apart on the basis of each of the resin-molded chips 14.

In the second transfer step, also, the adjacent devices 12 are spaced apart on the basis of each of the resin-molded chips 14, and are arranged in a matrix form as shown in the figure. Namely, the devices 12 are so transferred that the devices are spaced wider apart in the x direction, and the devices are so transferred that the devices are spaced wider apart also in the y direction orthogonal to the x direction. Where the positions of the devices arranged by the second transfer step are the positions corresponding to pixels of the final product such as an image display system, a roughly integer times of the initial pitch of the devices 12 is equal to the pitch of the devices 12 arranged by the second transfer step. Here, the value E of the roughly integer times is expressed by E=n×m, where n is the ratio of enlargement of the pitch attendant on the transfer from the first substrate 10 onto the temporary holding member 11, and m is the ratio of enlargement of the pitch attendant on the transfer from the temporary holding member 11 onto the second substrate 15. The enlargement ratios n and m may be integers, and may not be integers so long as the combination of n and m is such that E is an integer (for example, n=2.4 and m=5).

Wiring is applied to each of the devices 12 which are spaced apart on the basis of each of the resin-molded chips 14 on the second substrate 15. At this time, the wiring is conducted while suppressing as much as possible defects or failure in connection, by utilizing the electrode pads or the like preliminarily formed. The wiring includes wirings to p-electrodes and n-electrodes in the case where, for example, the devices 12 are light-emitting devices such as light-emitting diodes. In the case of liquid crystal control devices, the wiring includes such wirings as selection signal lines, voltage lines and orientation electrode films.

In the two-stage enlarged transfer method shown in FIG. 6, formation of the electrode pads and consolidation with the resin can be conducted by utilizing the spaces formed upon the first transfer, and wiring is conducted after the second transfer. The wiring is conducted while suppressing as much as possible the defects or failure in connection by utilizing the electrode pads or the like preliminarily formed. Therefore, the yield of the image display system can be enhanced. In addition, in the two-stage enlarged transfer according to the present embodiment, there are two steps in each of which the devices are spaced wider part. By conducting a plurality of steps of enlarged transfer for spacing the devices wider apart, the actual number of times of transfer is reduced. Namely, for example, where the ratio of enlargement of the pitch attendant on the transfer from the first substrate 10, 10a onto the temporary holding member 11, 11a is 2 (n=2) and the ratio of enlargement of the pitch attendant on the transfer from the temporary holding member 11, 11a onto the second substrate 15 is 2 (m=2), if transfer into the enlarged region is to be conducted by one time of transfer, the final ratio of enlargement is 2×2=4 times and it is necessary to conduct 16 (the square of 4) times of transfer, namely, 16 times of alignment of the first substrate. On the other hand, in the two-stage enlarged transfer method according to the present embodiment, it suffices to conduct the transfer or alignment 8 times, which is the simple sum of 4 times equal to the square of the enlargement ratio 2 in the first transfer step and 4 times equal to the square of the enlargement ratio 2 in the second transfer step. Namely, in the case of intending the same enlargement ratio in transfer, the number of times of transfer can necessarily be reduced by 2 nm times, since (n+m)2=n2+2 nm+m2. Therefore, the production steps can be reduced in time and cost by amounts corresponding to this number of times of transfer, which is profitable particularly where the enlargement ratio is large.

While the device 12 is, for example, a light-emitting device in the two-stage enlarged transfer shown in FIG. 6, the device 12 is not limited to the light-emitting diode but may be any of other devices, for example, a device selected from the group consisting of a liquid crystal control device, an opto-electric conversion device, a piezoelectric device, a thin film transistor device, a thin film diode device, a resistance device, a switching device, a minute magnetic device, a minute optical device, a part thereof, a combination thereof, etc.

Figure 7:
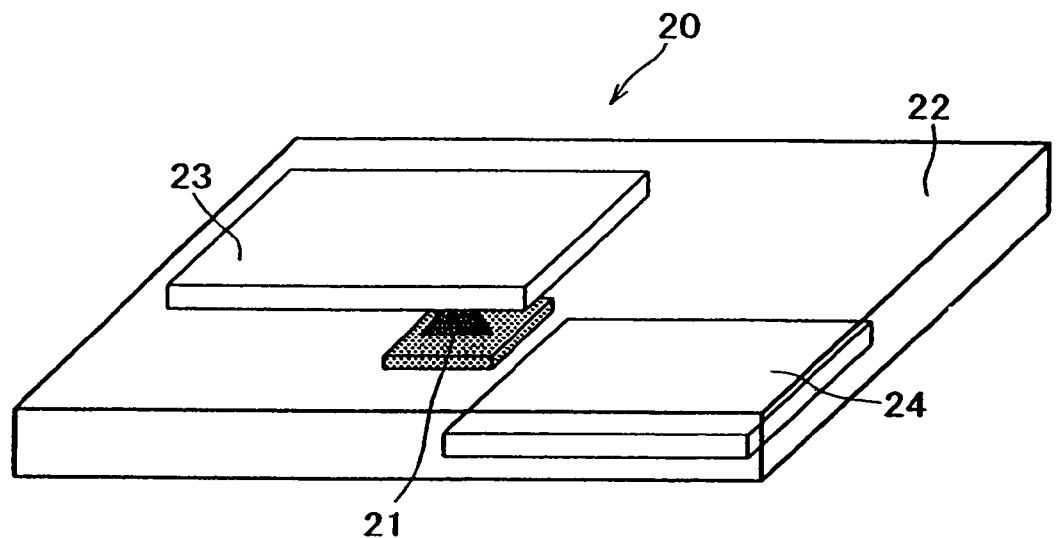
FIG. 7 is a general perspective view of a resin-molded chip.
Figure 8:
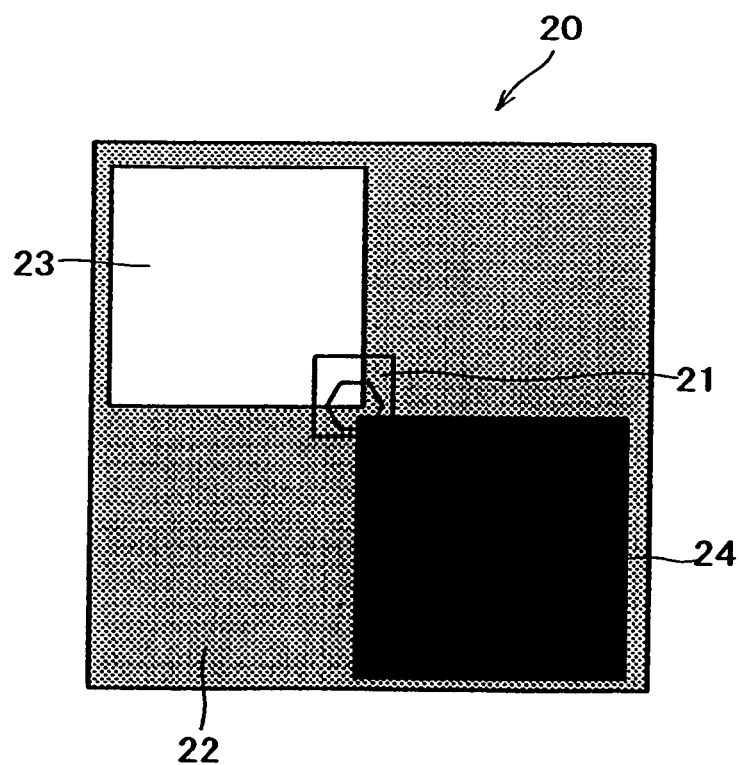
FIG. 8 is a general plan view of the resin-molded chip.

In the above transfer step, the light-emitting diodes are treated as resin-molded chips, and are respectively transferred from the temporary holding member onto the second substrate. The resin-molded chips will be described below referring to FIGS. 7 and 8. The resin-molded chip 20 is obtained by consolidating the surroundings of each of devices 21 spaced wider apart with a resin 22. The resin-molded chips 20 can be used in the case of transferring the devices 21 from the temporary holding member onto the second substrate. The resin-molded chip 20 is roughly flat plate shaped, and a primary surface thereof is roughly square in shape. The shape of the resin-molded chip 20 is the shape of the body obtained by consolidation with the resin 22; concretely, a uncured resin is applied so as to contain each of the devices 21, and after the resin is cured, the edge portions are cut by dicing or the like, to obtain the resin-molded chips 20. Incidentally, a surface of the resin-molded chip 20 on the side of the temporary holding member may be provided with a recessed portion as described above, and the scattering direction in the transfer step which will be described later may be controlled.

Electrode pads 23 and 24 are formed respectively on the face side and the back side of the roughly flat plate shaped resin 22. The formation of the electrode pads 23 and 24 is conducted by forming conductive layers such as a metallic layer and a polycrystalline silicon layer of a material for the electrode pads 23, 24 on the entire surface, and patterning the conductive layer into required electrode shapes by a photolithography technique. The electrode pads 23 and 24 are so formed as to be connected respectively to the p-electrode and the n-electrode of the device 21 which is a light-emitting device, and, if required, the resin 22 is provided with via holes or the like.

Here, while the electrode pads 23 and 24 are formed respectively on the face side and the back side of the resin-molded chip 20 in this embodiment, both the electrode pads may be formed on one side. For example, in the case of a thin film transistor, there are three electrodes, namely, source, gate and drain electrodes, so that three or more electrode pads may be formed. The positions of the electrode pads 23 and 24 are staggered in plan view, in order to ensure that contacts thereof can be provided on the upper side at the time of final formation of a wiring while preventing the contacts from overlapping with each other. The shape of the electrode pads 23 and 24 is not limited to square but may be other shape.

By constituting such a resin-molded chip 20 as above, the surroundings of the device 21 is covered with the resin 22, the electrode pads 23 and 24 can be formed with high accuracy by flattening, and the electrode pads 23 and 24 can be extended to a wider region as compared with the device 21, whereby handling thereof in proceeding the transfer in the subsequent second transfer step by use of a suction jig is facilitated. As will be described later, the final wiring is conducted after the subsequent second transfer step, so that by wiring by utilizing the comparatively large sized electrode pads 23 and 24, defects or failure in wiring can be prevented.

Figure 9A:
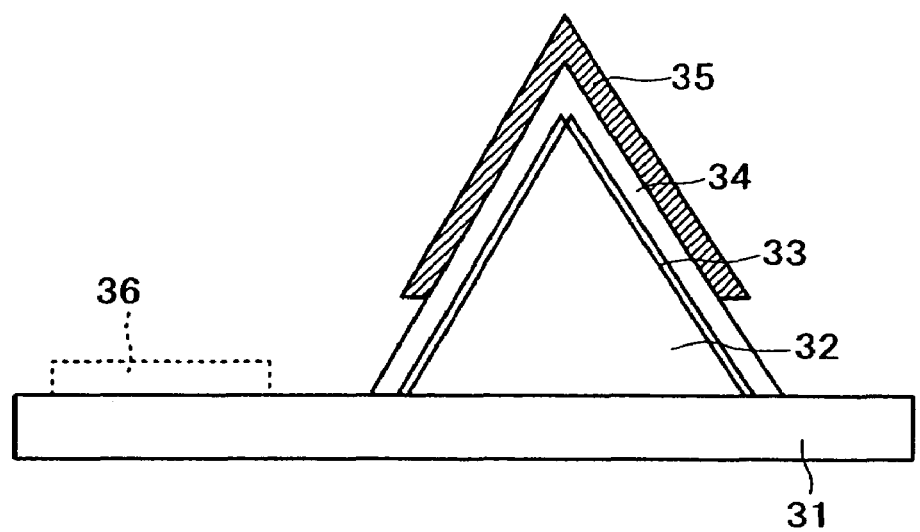
Figure 9B:
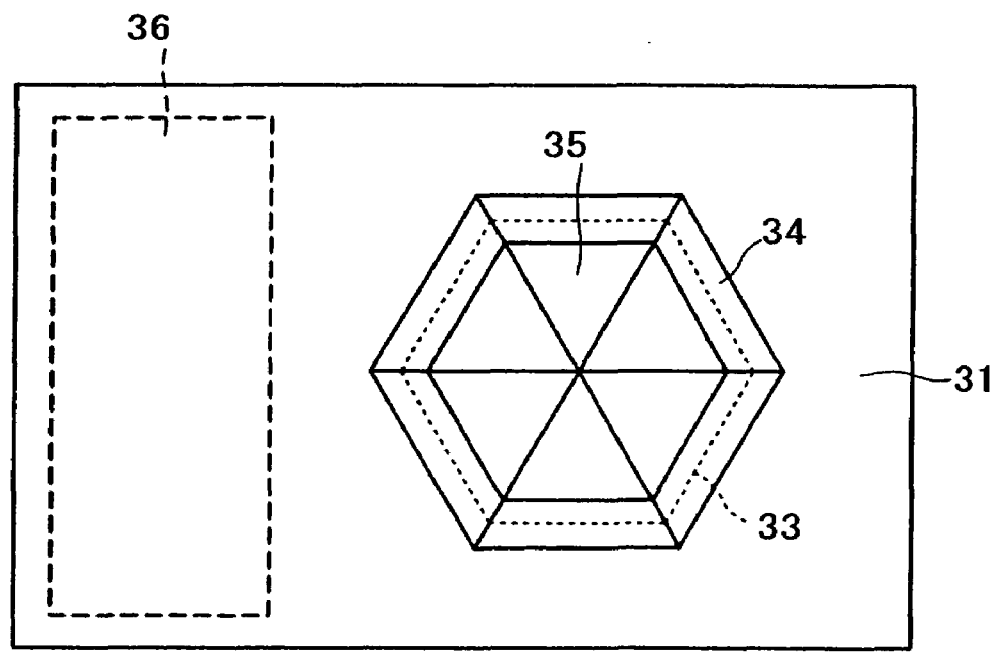

Next, FIGS. 9A and 9B show the structure of a light-emitting device as one example of the device used in the two-stage enlarged transfer method according to this embodiment. FIG. 9A is a sectional view of the device, and FIG. 9B is a plan view of the same. The light-emitting device is a GaN based light-emitting diode, and is formed, for example, by crystal growth on a sapphire substrate. Such a GaN based light-emitting diode is characterized in that irradiation with laser through the substrate causes laser ablation, and film exfoliation is generated at the interface between the sapphire substrate and the GaN based growth layer attendant on the phenomenon of gasification of nitrogen in GaN, whereby separation of the device can be facilitated.

First, as for the structure, a hexagonal pyramid shaped GaN layer 32 is formed by selective growth on a ground growth layer 31 consisting of a GaN based semiconductor layer. An insulating film not shown is present on the ground growth layer 31, and the hexagonal pyramid shaped GaN layer 32 is formed at an opened portion of the insulating film by an MOCVD method or the like. The GaN layer 32 is a pyramid shaped growth layer covered with S-planes (1–101 planes) where the primary surface of the sapphire substrate used at the time of growth is a C-plane, and is a silicon-doped region. The portions of the inclined S-planes of the GaN layer 32 each function as a clad with a double hetero structure. An InGaN layer 33 as an active layer is formed so as to cover the inclined S-planes of the GaN layer 32, and a magnesium-doped GaN layer 34 is formed on the outside thereof. The magnesium-doped GaN layer 34 also function as a clad.

Such a light-emitting diode as above is provided with a p-electrode 35 and an n-electrode 36. The p-electrode 35 is formed by vapor deposition of a metallic material such as Ni/Pt/Au or Ni(Pd)/Pt/Au formed on the magnesium-doped GaN layer 34. The n-electrode 36 is formed at the above-mentioned opened portion (not shown) of the insulating film by vapor deposition of a metallic material such as Ti/Al/Pt/Au. In the case where the n-electrode is taken out from the back side of the ground growth layer 31, formation of the n-electrode 36 is not needed on the face side of the ground growth layer 31.

The GaN based light-emitting diode having such a structure is a device capable also of emitting blue light, can be released from the sapphire substrate comparatively easily particularly by laser ablation, and selective release can be realized by selective irradiation with a laser beam. The GaN based light-emitting diode may have a structure in which an active layer is formed in a flat plate shape or a belt shape, and may have a pyramid structure with a C-plane at an upper end portion thereof. In addition, an other nitride based light-emitting device or a compound semiconductor device may also be adopted.

Figure 10:
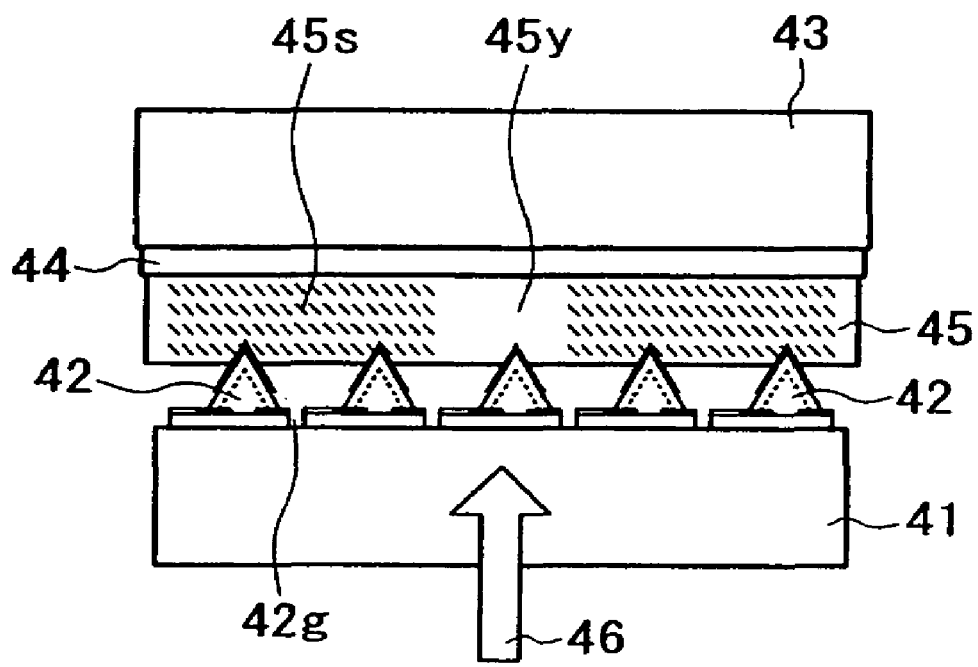
FIG. 10 is a general sectional view showing a first transfer step.

Next, a concrete technique of the method of arranging the light-emitting devices shown in FIG. 6 will be described, referring to FIGS. 10 to 17. The light-emitting device here is the GaN based light-emitting diode shown in FIGS. 9A and 9B. First, as shown in FIG. 10, a plurality of light-emitting diodes 42 are formed in a matrix form on a primary surface of a first substrate 41. The size of the light-emitting diode 42 can be about 20 μm. As a material for constituting the first substrate 41, a material having a high transmittance for the wavelength of the laser with which the light-emitting diode 42 is irradiated, such as a sapphire substrate, is used. The light-emitting diodes 42 have each been provided with up to the p-electrode, but have not yet been provided with the final wiring, and grooves 42g for separation of the devices have been formed, so that the individual light-emitting diodes 42 are in the state of being separatable. Formation of the grooves 42g is conducted, for example, by reactive ion etching. Such a first substrate 41 is opposed to a temporary holding member 43, and selective transfer is conducted as shown in FIG. 10.

A release layer 44 and an adhesive layer 45 are formed in two layers on a surface of the temporary holding member 43 opposed to the first substrate 41. Here, as an example of the temporary holding member 43, there may be used a glass substrate, a quartz glass substrate, a plastic substrate, and the like. As an example of the release layer 44 on the temporary holding member 43, there may be used a fluoro coat, a silicone resin, a water-soluble adhesive (for example, polyvinylalcohol: PVA), polyimide, and the like. As the adhesive layer 45 of the temporary holding member 43, there may be used a layer of any of an ultraviolet ray (UV)-curable type adhesive, a thermosetting adhesive, and a thermoplastic adhesive. As one example, a quartz glass substrate is used as the temporary holding member 43, a polyimide film of 4 μm in thickness is formed as the release layer 44, and thereafter a UV-curable type adhesive is formed in a thickness of about 20 μm as the adhesive layer 45.

The adhesive layer 45 of the temporary holding member 43 is so conditioned that cured regions 45s and uncured regions 45y are mixedly present, and is so positioned that the light-emitting diodes 42 to be selectively transferred are located in the uncured regions 45y. The conditioning to ensure that the cured regions 45s and the uncured regions 45y are mixedly present can be conducted, for example, by selectively irradiating the UV-curable type adhesive with UV light by an exposure apparatus at a pitch of 200 μm to ensure that the regions of transfer of the light-emitting diodes 42 are uncured and the other regions are cured. After such an alignment, the light-emitting diodes 42 at the transfer object positions are irradiated with laser from the back side of the first substrate 41, and these light-emitting diodes 42 are released from the first substrate 41 by utilizing laser ablation. Since the GaN based light-emitting diode 42 is decomposed into metallic Ga and nitrogen at the interface between itself and the sapphire, the light-emitting diode 42 can be released comparatively easily. As the laser for irradiation, there may be used excimer laser, higher harmonic YAG laser and the like.

By the release utilizing the laser ablation, the light-emitting diodes 42 pertaining to the selective irradiation are separated at the interface between the GaN layer and the first substrate 41, and are transferred so that the p-electrode portions pierce into the adhesive layer 45 on the opposite side. As for the other light-emitting diodes 42 located in the regions which are not irradiated with the laser, the corresponding portions of the adhesive layer 45 are cured regions s, where irradiation with the laser is not conducted, so that the light-emitting diodes 42 are not transferred to the side of the temporary holding member 43. While only one light-emitting diode 42 is selectively irradiated with the laser in FIG. 10, the light-emitting diodes 42 are irradiated with the laser similarly in the regions spaced apart by the n pitch amounts. By such selective transfer, the light-emitting diodes 42 are arranged on the temporary holding member 43 in the state of being spaced wider apart than they have been arranged on the first substrate 41.

Figure 11:
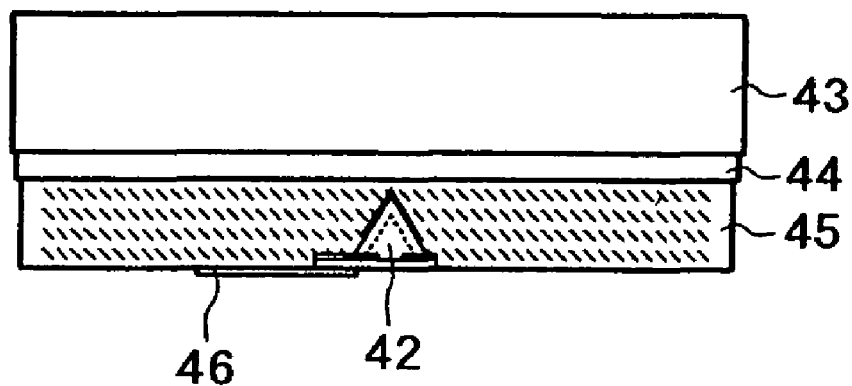
FIG. 11 is a general sectional view showing an electrode pad forming step.

Under the condition where the light-emitting diode 42 is held on the adhesive layer 45 of the temporary holding member 43, the back side of the light-emitting diode 42 is the n-electrode side (cathode side), and the back side of the light-emitting diode 42 is deprived of the resin (adhesive) and cleaned. Therefore, when the electrode pad 46 is formed as shown in FIG. 11, the electrode pad 46 is electrically connected to the back side of the light-emitting diode 42.

As an example of cleaning the adhesive layer 45, the adhesive resin is etched by oxygen plasma, followed by cleaning by irradiation with UV ozone. When the GaN based light-emitting diode is released from the first substrate 41 consisting of a sapphire substrate by laser, Ga is deposited on the release surface, and, therefore, it is necessary to etch the deposited Ga; the etching is conducted by use of an aqueous NaOH solution or diluted nitric acid. Thereafter, the electrode pad 46 is patterned. At this time, the electrode pad on the cathode side can be about 60 $\mu$m square. As the electrode pad 46, there is used such a material as a transparent electrode (ITO, ZnO based, etc.) or Ti/Al/Pt/Au. In the case of the transparent electrode, light emission is not hampered even if the back side of the light-emitting diode is largely covered with the transparent electrode, so that a large electrode can be formed with a rough patterning accuracy, and patterning process is facilitated.

After the formation of the electrode pads 46, the cured adhesive layer 45 is cut on the basis of each of the light-emitting diodes 42 by a dicing process, to obtain resin-molded chips corresponding to the light-emitting diodes 42. The dicing process here is conducted, for example, by laser dicing using a laser beam. The cutting width of the dicing depends on the size of the light-emitting diode 42 covered with the adhesive layer 45 in the pixel of the image display system. Where cutting with a width of not more than 20 $\mu$m is required, it is preferable to perform laser processing using the laser beam. As the laser beam, there may be used excimer laser, higher harmonic YAG laser, carbon dioxide laser and the like. Naturally, the dicing process may be conducted by mechanical processing.

Figure 12:
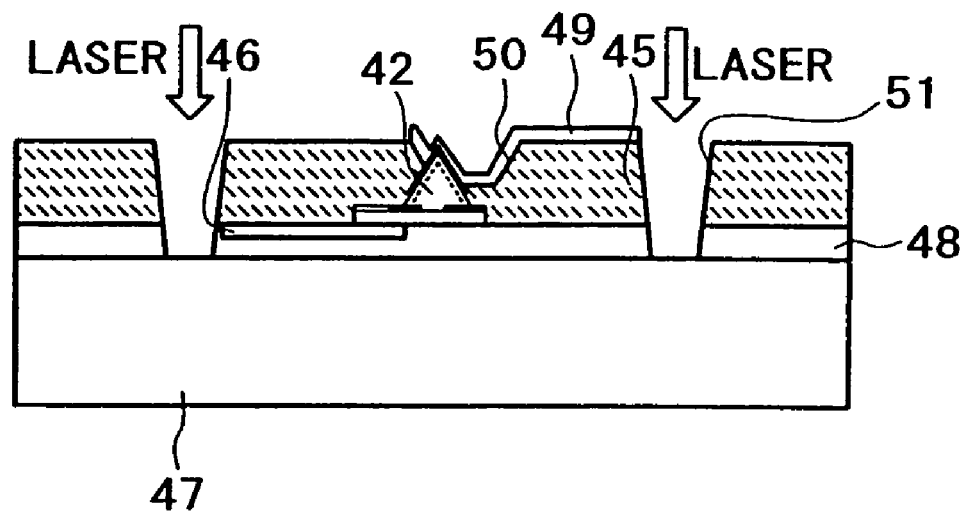
FIG. 12 is a general sectional view showing the electrode pad forming step and a dicing step, after transfer onto a second temporary holding member.

FIG. 12 shows the condition where the light-emitting diode 42 has been transferred from the temporary holding member 43 onto a second temporary holding member 47, a via hole 50 on the side of the anode (p-electrode) has been formed, thereafter an electrode pad 49 on the anode side has been formed, and the adhesive layer 45 consisting of a resin has been diced. As a result of the dicing, device separation grooves 51 are formed, whereby the light-emitting diodes 42 are demarcated on the basis of each device. The device separation grooves 51 consist of a plurality of parallel lines extended in crossing directions in a plane surface pattern, in order to separate each of the light-emitting diodes 42 arranged in a matrix form. At bottom portions of the device separation grooves 51, the surface of the second temporary holding member 47 is exposed. One example of the second temporary holding member 47 is the so-called dicing sheet comprising a plastic substrate coated with a UV pressure sensitive adhesive, of which the tack strength is lowered upon irradiation with UV rays.

As an example of the process, the surface of the adhesive layer 45 is etched with oxygen plasma until the surface of the light-emitting diode 42 is exposed. Formation of the via hole 50 is also conducted by use of excimer laser, higher harmonic YAG laser, carbon dioxide laser or the like. At this time, the via hole is opened with a diameter of about 3 to 7 $\mu$m. The electrode pad on the anode side is formed of Ni/Pt/Au or the like. At the time of forming the via hole 50, it is preferable to defocus the laser beam so as to enlarge the taper angle, as has been described above. By enlarging the taper angle of the via hole 50, metal vapor deposition properties and plating properties of the electrode pad 49 on the anode side are enhanced, and defects or failure in conduction is restrained.

The dicing process is conducted by dicing using a laser beam, as described above. The cutting width depends on the size of the light-emitting diode 42 covered with the adhesive layer 45 consisting of a resin in the pixel of the image display system. As an example, groove processing with a width of about 40 $\mu$m is conducted by excimer laser, to form the chip shape.

Next, the light-emitting diodes 42 are released from the second temporary holding member 47 by use of a mechanical means. At this time, a release layer 48 is formed on the second temporary holding member 47. The release layer 48 can be formed, for example, by use of a fluoro coat, a silicone resin, a water-soluble adhesive (for example, PVA), polyimide or the like. Irradiation with, for example, YAG third harmonic laser is conducted from the back side of the second temporary holding member 47 provided with the release layer 48. By this, for example where polyimide is used as the release layer 48, exfoliation is generated at the interface between the polyimide and the quartz substrate due to ablation of the polyimide, whereby each of the light-emitting diodes 42 can be easily released from the second temporary holding member 47 by the mechanical means.

Figure 13:
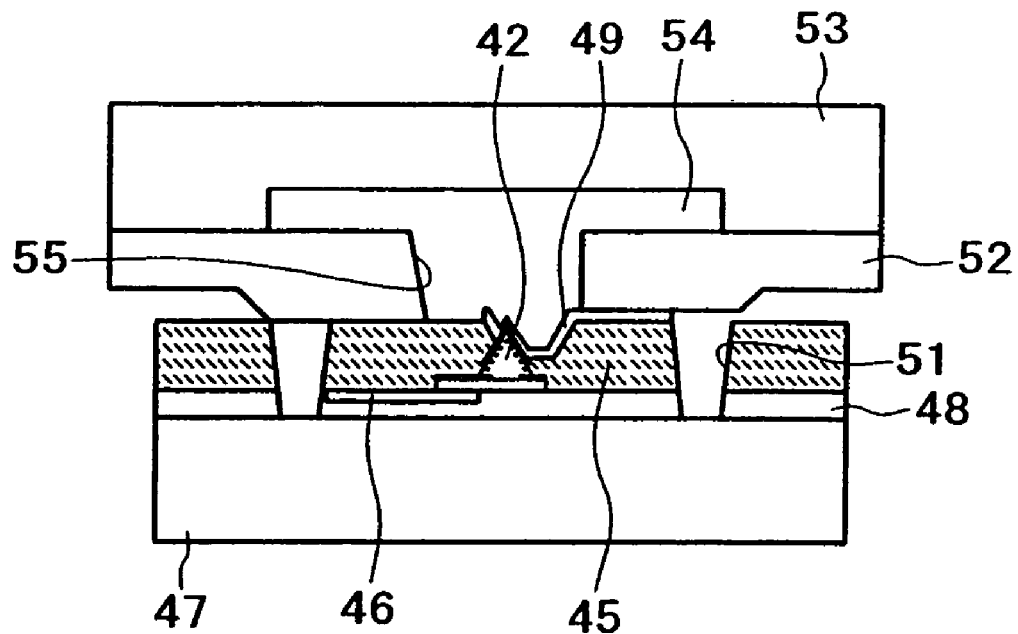
FIG. 13 is a general sectional view showing a suction step.

FIG. 13 is a view showing the condition where the light-emitting diodes 42 arranged on the second temporary holding member 47 are picked up by a suction apparatus 53. At this time, suction holes 55 are opened in a matrix form at a pixel pitch of the image display system, and a multiplicity of the light-emitting diodes 42 can be collectively picked up at a stroke. At this time, the opening diameter is, for example, about $\phi$100 $\mu$m, and the holes are opened in a matrix form at a pitch of 600 $\mu$m, so that about 300 light-emitting diodes 42 can be picked up at a stroke. The member of the suction holes 55 at this time may be one produced by Ni electroforming, or a metallic plate 52 such as a stainless steel (SUS) bored by etching, and a suction chamber 54 is formed on the depth side of the suction holes 55 of the metallic plate 52. By such a control as to provide a negative pressure in the suction chamber 54, the light-emitting diodes 42 can be picked up. At this stage, the light-emitting diodes 42 are covered with the resin and their upper surfaces are roughly planarized, so that selective suction by the suction apparatus 53 can proceed easily.

Figure 14:
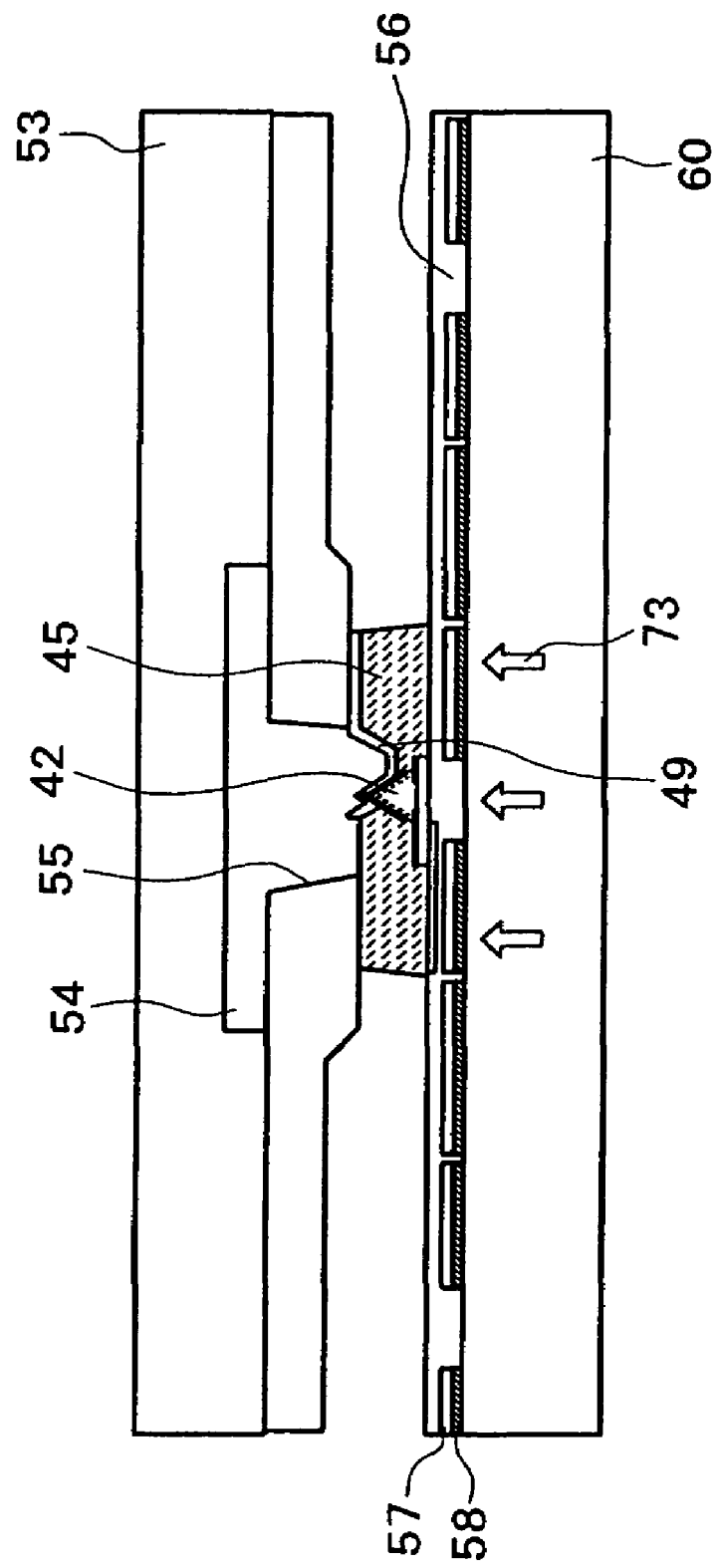
FIG. 14 is a general sectional view showing a second transfer step.

FIG. 14 is a view showing the condition where the light-emitting diodes 42 are transferred onto a second substrate 60. At the time of fitting to the second substrate 60, the second substrate 60 is preliminarily coated with an adhesive layer 56, and the portions of the adhesive layer 56 beneath the light-emitting diodes 42 are cured, whereby the light-emitting diodes 42 can be arranged in the state of being attached to the second substrate 60. At the time of fitting, the suction chamber 54 of the suction apparatus 53 is provided with a high pressure, whereby the coupling between the suction apparatus 53 and the light-emitting diodes 42 by suction is released. The adhesive layer 56 may be formed of a UV-curable type adhesive, a thermosetting adhesive, a thermoplastic adhesive or the like. The positions of arrangement of the light-emitting diodes 42 are spaced wider apart than they have been arranged on the temporary holding member 43 and on the second temporary holding member 47. In this case, the energy for curing the resin of the adhesive layer 56 is supplied from the back side of the second substrate 60. Only the portions beneath the light-emitting diodes 42 is cured by a UV irradiation apparatus in the case of the UV-curable type adhesive, and by laser in the case of the thermosetting adhesive; in the case of the thermoplastic adhesive, the adhesive is melted and adhesion is effected similarly by irradiation with laser.

In addition, an electrode layer 57 functioning also as a shadow mask is disposed on the second substrate 60, and, particularly, a black chromium layer 58 is formed on the surface on the screen side of the electrode layer 57, namely, on the side of the viewers of the image display system. By this, it is possible to enhance the contrast of the images, and to enhance the energy absorption coefficient of the black chromium layer 58, thereby causing the adhesive layer 56 to be cured quickly upon selective irradiation with laser 73. The irradiation with UV rays at the time of transfer is about 1000 mJ/cm2 in the case of the UV-curable type adhesive.

Figure 15:
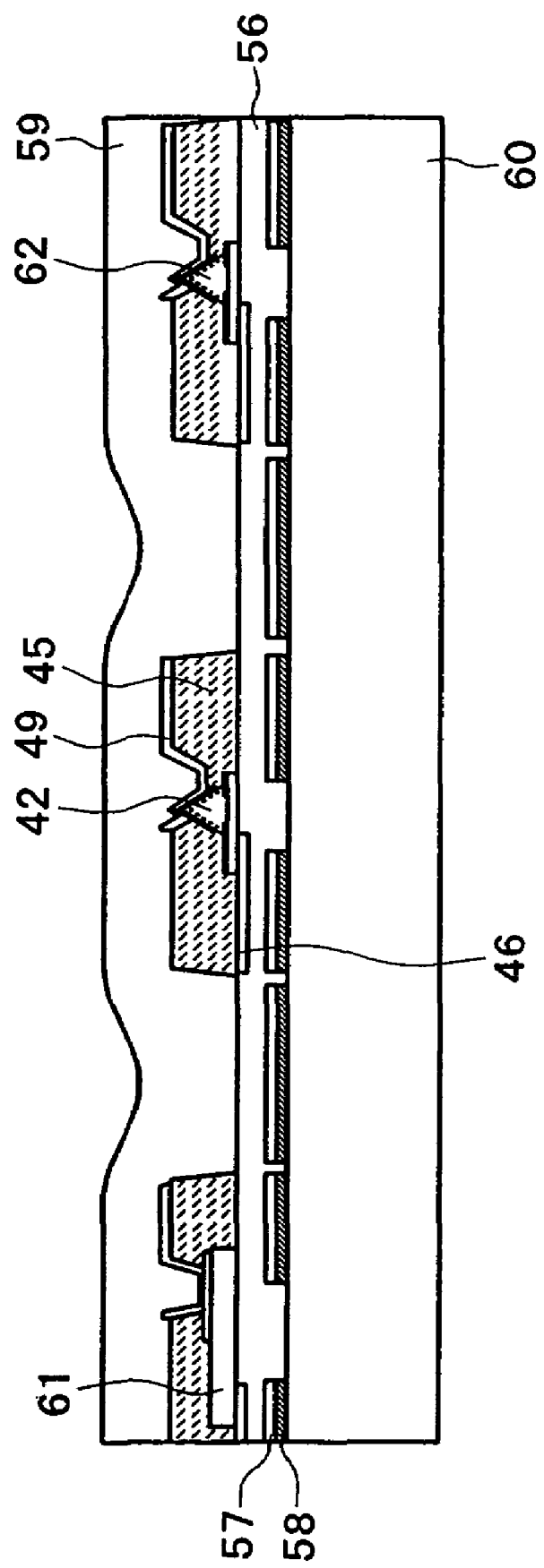
FIG. 15 is a general sectional view showing an insulating layer forming step.

FIG. 15 is a view showing the condition where RGB three color light-emitting diodes 42, 61 and 62 are arranged on the second substrate 60 and are coated with an insulating layer 59. When the light-emitting diodes are mounted on the second substrate 60 by simply staggering them to respective color positions by directly using the suction apparatus 53 used in FIGS. 13 and 14, it is possible to form an image in three colors while making constant the pitch of pixels. As the insulating layer 59, there may be used a transparent epoxy adhesive, a UV-curable type adhesive, polyimide or the like. The three color light-emitting diodes 42, 61 and 62 may not necessarily have the same shape. In FIG. 15, the red light-emitting diode 61 has a structure in which a hexagonal pyramid shaped GaN layer is absent, and is different from the other light-emitting diodes 42 and 62 in shape. At this stage, the light-emitting diodes 42, 61 and 62 have already been covered with the resin to be resin-molded chips, so that they can be treated in the same manner, irrespectively of the difference in device structure.

Figure 16:
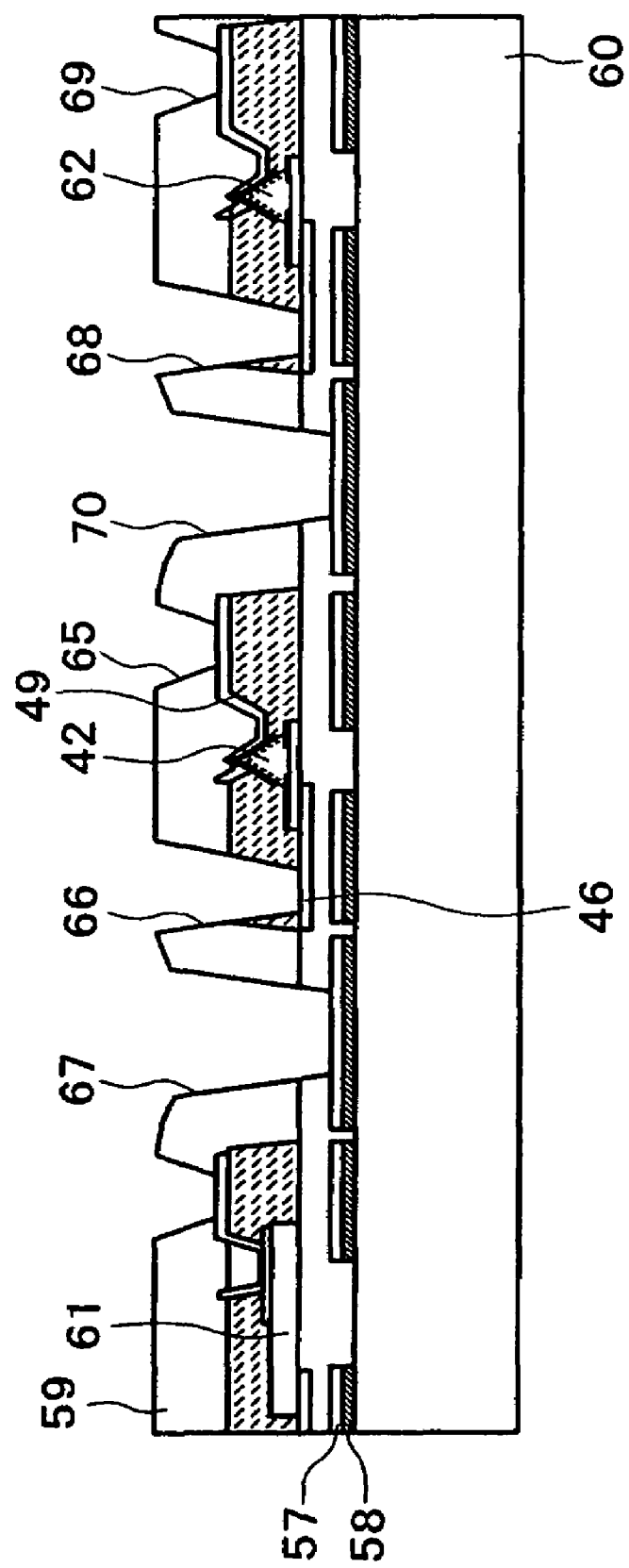
FIG. 16 is a general sectional view showing a via hole forming step.

Next, as shown in FIG. 16, in correspondence with the electrode pads 46 and 49 of the light-emitting diodes 42 and the electrode layer 57 on the second substrate 60, opening portions (via holes) 65, 66, 67, 68, 69 and 70 for electrically connecting them are formed. Formation of the opening portions is also conducted by use of a laser beam. In this case, also, it is preferable to defocus the laser beam so as to enlarge the taper angles of the opening portions 65, 66, 67, 68, 69 and 70, in the same manner as in the laser via processing in the inter-layer connection described above.

The opening portions, namely, the via holes formed at this time may be large in shape because the electrode pads 46 and 49 of the light-emitting diodes 42, 61 and 62 are large in area; the accuracy of positions of the via holes can also be rougher than in the case of the via holes formed directly in the light-emitting diodes. The size of the via holes can be about $\phi 20~\mu m$, for the electrode pads 46 and 49 of about 60 $\mu m$ square in size. The depths of the via holes H are of three kinds, one for connection with the wiring substrate, one for connection with the anode, and one for connection with the cathode. In forming the via holes H, the depth is controlled, for example, by varying the number of pulses of the laser, whereby the via holes are opened with optimum depths.

Figure 17:
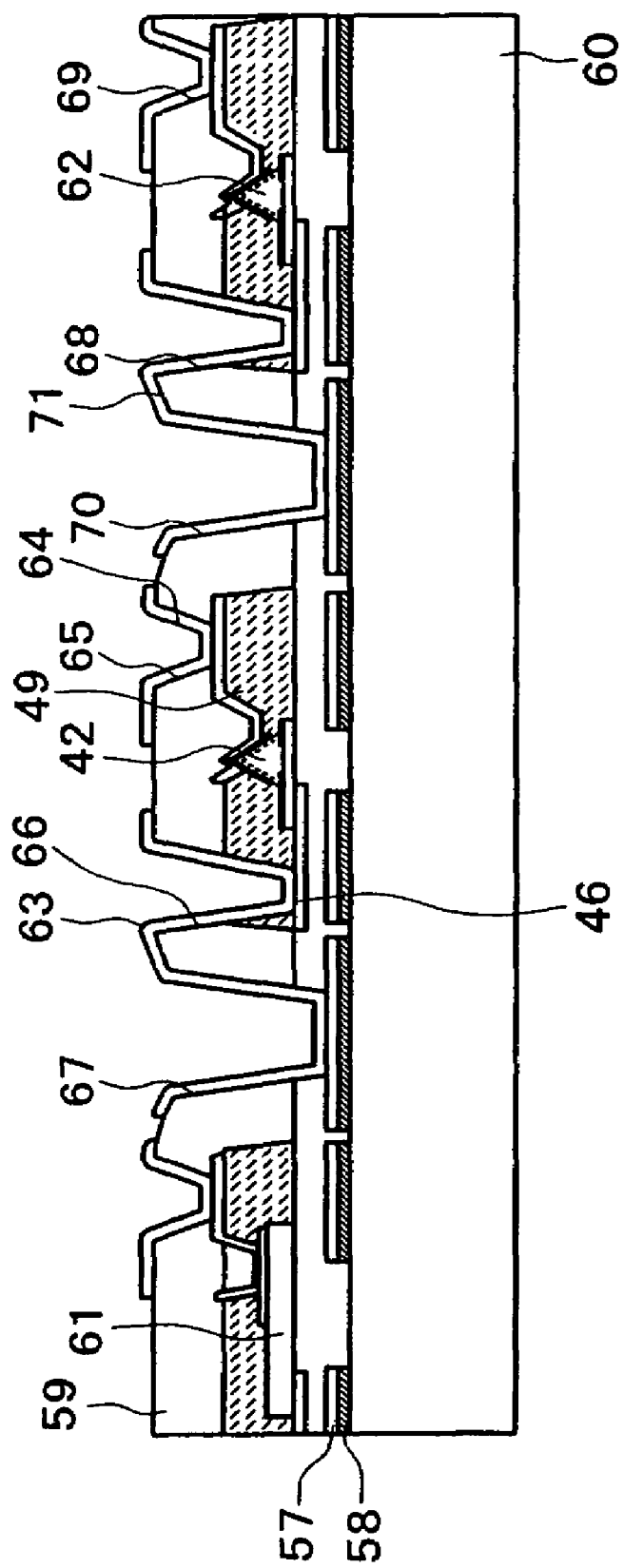
FIG. 17 is a general sectional view showing a wiring forming step.

FIG. 17 is a view showing a wiring forming step. The figure shows the condition where, after the formation of the opening portions 65, 66, 67, 68, 69 and 70 in the insulating layer 59, wirings 63, 64 and 71 for connection between the anode and cathode electrode pads of the light-emitting diodes 42, 61 and 62 and the wiring electrode layer 57 of the second substrate 60 have been formed.

Thereafter, a protective layer is formed on the wirings, to complete the panel of the image display system. The protective layer at this time can be formed of such a material as a transparent epoxy adhesive, in the same manner as the insulating layer 59 of FIG. 10. The protective layer is thermally cured, and thereby the wirings are entirely covered with the protective layer. Thereafter, a driver IC is connected to the wiring at an end portion of the panel, thereby manufacturing a driving panel.

In the method of arranging the light-emitting devices as described above, at the time when the light-emitting diodes 42 are held on the temporary holding member 43, the intervals of the devices have already been enlarged, so that comparatively large-sized electrode pads 46 and 49 and the like can be provided by utilizing the widened intervals. Since wiring is conducted by utilizing the comparatively large-sized electrode pads 46 and 49, wiring can be formed easily even where the size of the final system is extremely larger than the device size. In addition, in the method of arranging the light-emitting devices according to the present embodiment, the surroundings of the light-emitting diodes 42 are covered with a cured adhesive layer 45, which is planarized, whereby the electrode pads 46 and 49 can be formed with high accuracy, and the electrode pads 46 and 49 can be extended to wider regions as compared with the devices, so that handling is facilitated in the case of conducting the transfer in the subsequent second transfer step by use of a suction jig.

As is clear from the above description, according to the wiring forming method of the present invention, the opening portions (via holes) can be easily formed, and the taper angle of the via holes thus formed can be enlarged, resulting in that a wiring free of defects or failure in conduction can be formed. Therefore, inter-layer connection can be securely achieved in a multi-layer wiring substrate.

In addition, according to the device arranging method of the present invention, transfer of the devices can be performed efficiently and securely while maintaining the merits of the wiring forming method, and the enlarged transfer in which the devices are spaced wider apart can be carried out smoothly. Similarly, according to the method of manufacturing an image display system of the present invention, the light-emitting devices formed by minute processing in a dense state, namely, in a high degree of integration can be rearranged while spacing them wider apart efficiently, and, therefore, an image display system with high accuracy can be manufactured with high productivity.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A method of manufacturing an image display system including light-emitting devices, comprising:
   arranging the light-emitting devices in a matrix form;
   forming a first wiring layer including an electrode pad connected to each of the light-emitting devices;
   forming an insulating layer on the first wiring layer;
   forming an opening portion in the insulating layer by irradiation of the insulating layer with a laser beam, wherein the irradiation with the laser beam is so conducted that a side wall of the opening portion is inclined by not less than about 20 degrees relative to the vertical direction; and forming a second wiring layer connected to each of the light-emitting devices, wherein the second wiring layer is formed directly on at least the side wall of the opening portion.

2. The method of manufacturing an image display system including light-emitting devices as set forth in claim 1, wherein the insulating layer is irradiated with a laser beam having a focus position staggered to thereby form the opening position.

3. The method of manufacturing an image display system including light-emitting devices as set forth in claim 1, wherein the insulating layer includes a resin material.

4. The method of manufacturing an image display system including light-emitting devices as set forth in claim 1, wherein the second wiring layer is formed by any one of vapor deposition and plating.

5. The method of manufacturing an image display system including light-emitting devices as set forth in claim 1, wherein a depth of the opening portion is controlled by varying a pulse of the laser beam during irradiation.

* * * * *